United States Patent
Tsai et al.

(10) Patent No.: US 11,994,558 B2
(45) Date of Patent: May 28, 2024

(54) ELECTRONIC DEVICE TEST METHOD AND TEST DEVICE

(71) Applicant: Realtek Semiconductor Corp., HsinChu (TW)

(72) Inventors: Han-Yun Tsai, HsinChu (TW); Shih-Hung Wang, HsinChu (TW); Ting-Ying Wu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 63 days.

(21) Appl. No.: 17/978,228

(22) Filed: Nov. 1, 2022

(65) Prior Publication Data

US 2023/0132675 A1    May 4, 2023

(30) Foreign Application Priority Data

Nov. 1, 2021   (TW) ................. 110140559

(51) Int. Cl.
| | |
|---|---|
| *G06F 11/10* | (2006.01) |
| *G01R 31/3183* | (2006.01) |
| *G11C 7/10* | (2006.01) |
| *H01L 23/00* | (2006.01) |
| *H01L 23/538* | (2006.01) |
| *H03M 13/00* | (2006.01) |
| *H03M 13/29* | (2006.01) |

(52) U.S. Cl.
CPC .... *G01R 31/318328* (2013.01); *G11C 7/1072* (2013.01)

(58) Field of Classification Search
CPC ............... G01R 31/318328; G11C 7/1072
See application file for complete search history.

(56) References Cited

U.S. PATENT DOCUMENTS

| | | | |
|---|---|---|---|
| 2005/0102594 A1* | 5/2005 | Dey ............... | G01R 31/318328 714/733 |
| 2005/0166110 A1* | 7/2005 | Swanson ........ | G01R 31/318328 714/728 |
| 2011/0069604 A1* | 3/2011 | Schmukler ........... | H03H 11/265 370/201 |
| 2014/0095951 A1* | 4/2014 | Ahmed .......... | G01R 31/318536 714/E11.155 |
| 2015/0199466 A1* | 7/2015 | Basu .................... | G06F 30/398 716/115 |

* cited by examiner

*Primary Examiner* — Guy J Lamarre
(74) *Attorney, Agent, or Firm* — Winston Hsu

(57) ABSTRACT

An electronic system test method, comprising: (a) inputting a victim test pattern to a victim signal path of a target electronic system and simultaneously inputting at least one aggressor test pattern to at least one aggressor signal path of the target electronic system, according to a major set of test patterns comprising a plurality of minor set of test patterns; (b) acquiring a output response corresponding to the step (a); and (c) after changing the victim test pattern or the aggressor test pattern, and after repeating the step (a) and the step (b) until all of the major test patterns set are used thereby acquiring a plurality of the output responses, determining a combination level according to the output responses. The victim test pattern is an X bit pattern and the aggressor test pattern is a Y bit pattern, X and Y are positive integers larger than or equal to 3.

20 Claims, 4 Drawing Sheets

ELECTRONIC DEVICE TEST METHOD AND TEST DEVICE

BACKGROUND OF THE INVENTION

1. Field of the Invention

The present invention relates to an electronic system test method and a test device, and particularly relates to an electronic system test method and a test device which can acquire required output responses of test patterns and can estimate the performance of a plurality of signal paths with simpler and shorter test patterns.

2. Description of the Prior Art

Conventionally, in an electronic system test, an eye diagram is usually used to determine the performance of the entire electronic system. However, this test method requires a test pattern with a sufficient length to generate the required eye diagram. For example, while using Pseudo-Random Binary Sequence (PRBS), the commonly used PRBS-7 signal has a length of at least 127 bits. Moreover, the conventional electronic system test only estimates the eye diagram of a single signal path, and does not consider the cross talk effect caused by the adjacent signal paths.

SUMMARY OF THE INVENTION

One objective of the present invention is to provide an electronic system test method which can use test patterns with fewer bits.

Another objective of the present invention is to provide a test device which can use test patterns with fewer bits.

One embodiment of the present invention discloses an electronic system test method, for testing a target electronic system, comprising: (a) inputting a victim test pattern to a victim signal path of the target electronic system and simultaneously inputting at least one aggressor test pattern to at least one aggressor signal path of the target electronic system, according to a major set of test patterns comprising a plurality of minor set of test patterns; (b) acquiring a output response of test pattern corresponding to the step (a); and (c) after changing the victim test pattern or the aggressor test pattern, and after repeating the step (a) and the step (b) until all of the major set of test patterns are used thereby acquiring a plurality of the output responses, determining a combination level according to the output responses. The victim test pattern is an X bit pattern and the aggressor test pattern is a Y bit pattern, X and Y are positive integers larger than or equal to 3.

Another embodiment of the present invention discloses a test device, for estimating the performance of a target electronic system, comprising: a storage device, configured to store at least one program; and a processing circuit, configured to execute the program to perform the above-mentioned electronic system test method.

In view of above-mentioned embodiments, the number of bits of the test pattern can be decreased to reduce the amount of data in the test process and the required test time. In addition to the signal integrity problems caused by the single signal path, e.g. inter-symbol interference (ISI) or reflection, the cross talk effect caused by the adjacent signal paths is also considered.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Each component in following descriptions can be implemented by hardware (e.g. a device or a circuit) or hardware with software (e.g. a program installed to a processor). Besides, the method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices.

Figure 1:
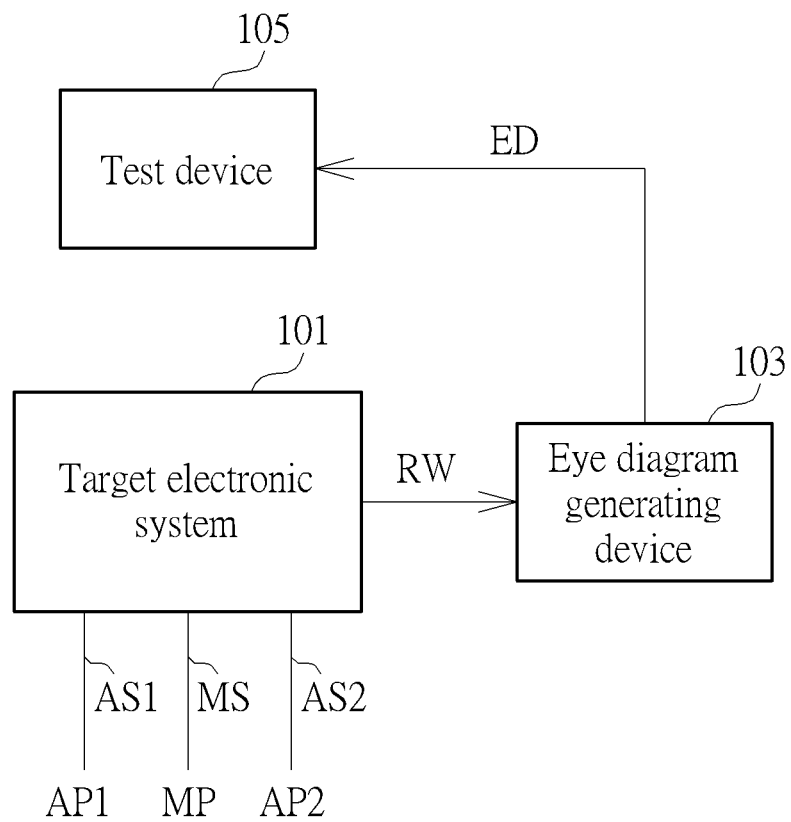
FIG. 1 is a block diagram illustrating that a target electronic system is estimated the performance by a test device, according to one embodiment of the present invention.

FIG. 1 is a block diagram illustrating that a target electronic system is estimated the performance by a test device, according to one embodiment of the present invention. As shown in FIG. 1, the target electronic system 101 may comprise at least one electronic device, and comprise a victim signal path MS and a plurality of aggressor signal paths (in the following embodiment, two aggressor signal paths AS1, AS2, but not limited). In one embodiment, the victim signal path MS and the aggressor signal paths AS1 and AS2 are both signal transmission path of the target electronic system 101. During the test, a victim test pattern MP is input to the victim signal path MS of the target electronic system 101 according to a major set of test patterns containing a plurality of minor set of test patterns, and the aggressor test patterns AP1, AP2 are input to the aggressor signal paths AS1 and AS2 of the target electronic system 101 at the same time. The victim test pattern MP or the aggressor test patterns AP1, AP2 may be generated by the test device 105 or may be generated by a device other than the test device 105. The victim test pattern is an X bit pattern and the aggressor test pattern is a Y bit pattern. X and Y are positive integers greater than or equal to 3, and X and Y can be the same positive integer or different positive integers. By inputting test patterns to the victim signal path MS and a plurality aggressor signal paths AS1 and AS2 at the same time, in addition to the influence of the test pattern on the victim signal path MS, the influence that the test patterns in the aggressor signal paths AS1, AS2 cause to the victim signal path MS can also be estimated.

The target electronic system 101 generates output responses RW corresponding to the test patterns including different victim test patterns MP and aggressor test patterns AP1, AP2. The eye diagram generating device 103 is configured to receive the output responses RW and to generate an eye diagram ED corresponding to the output responses RW. In one embodiment, the eye diagram generating device 103 generates the eye diagram according to the output responses RW corresponding to all of the major set of test patterns. The detail steps will be explained in subsequent examples.

The test device 105 determines the combination level of the major set of the test patterns according to the eye diagram ED. Please also note that, in one embodiment, the quality of the eye diagram ED can also be determined visually by the tester, instead of being calculated by the testing device 105. The aforementioned X and Y values can be set corresponding to the required test data and the required test time. The larger the value of X and Y, more test data can be used to generate the eye diagram, and the more accurate the determination of the eye diagram is, but a longer test time is required. On the contrary, the smaller the value of X and Y, the less the test data is, but the required test time can be correspondingly reduced. Please note, in the embodiment in FIG. 1, the combination level is determined by an eye diagram corresponding to the output responses RW. However, the combination level can also be determined by other parameters of the output responses RW.

As mentioned above, after acquiring the output responses RW corresponding to a minor set of victim test patterns and the aggressor test patterns, the victim test pattern or the aggressor test pattern is changed, and the foregoing steps are repeated to generate a plurality of output responses RW, until all test patterns in the major set of test patterns have been tested. For example, the first input victim test pattern and aggressor test patterns are (MP, AP1, AP2), and the output response is RW1. In the next round of test, change the victim test pattern and the aggressor test pattern to (MP, AP1, AP3), and get the output response RW2. Then in the next round of test, change the victim test pattern and the aggressor test pattern to (MPa, AP1, AP2), and get the output response RW3. Therefore, after the test of the three victim test patterns and the different aggressor test patterns, three output responses RW1, RW2, and RW3 can be obtained. Then, the eye diagrams are generated based on the superposition of the output responses RW1, RW2, and RW3. If the result of the eye diagram is better, for example, the clearer the eye diagram or the larger the eye opening, the performance of the target electronic system 101 is better with the major set of test patterns.

Table 1 shown below illustrates an example of a major set of test patterns. However, please note that these sets are only used as examples, and the test patterns can be built according to different requirements.

TABLE 1

|  | Test pattern 1 | Test pattern 2 | Test pattern 3 | Test pattern 4 | Test pattern 5 | Test pattern 6 | Test pattern 7 | Test pattern 8 |
|---|---|---|---|---|---|---|---|---|
| AS1 | 010 | 101 | 010 | 101 | 010 | 101 | 010 | 101 |
| MS | 010 | 010 | 101 | 101 | 000 | 000 | 111 | 111 |
| AS2 | 010 | 101 | 010 | 101 | 010 | 101 | 010 | 101 |

In the major set of test patterns shown in Table 1, 8 minor set of test patterns are comprised, and each minor set of test patterns comprises a victim test pattern MP and two aggressor test patterns AP1 and AP2. The first test pattern input to the victim signal path MS and the aggressor signal paths AS1 and AS2 is the test pattern 1. After the output response of the test pattern 1 is obtained, the test pattern input to the victim signal path MS and the aggressor signal path AS1 and AS2 is switched to the test pattern 2. That is, the aggressor test patterns input to the aggressor signal path AS1 and AS2 are switched from 010 to 101, while the victim test pattern input to the victim signal path MS remains at 010, and the corresponding output response is obtained. The other test patterns also follow the same rules, until all 8 minor set of test patterns are all used to be input pattern.

The test patterns in Table 1 follow at least one of the following rules, but are not limited. In the embodiment in Table 1, the same aggressor test pattern is input to different aggressor signal paths. In one embodiment, the victim test pattern and the aggressor test pattern are the same, for example, test pattern 1 and test pattern 4. Also, according to Table 1, the victim test pattern and the aggressor test pattern respectively contain at least one of the following values: 010, 101, 000, and 111. In detail, the victim test pattern may comprise one of the following values: 010, 101, 000, and 111, and the aggressor test pattern may comprise one of the following values: 010 and 101. Also, according to Table 1, in one embodiment, the victim test pattern and the aggressor test pattern do not comprise any other value other than 010, 101, 000, and 111.

As mentioned above, the combination level can be determined based on the eye diagram. Therefore, in one embodiment, the victim test patterns and aggressor test patterns to be comprised in the minor set of test patterns are determined by the portion of the eye diagram to be estimated. Taking Table 1 as an example, if whole eye diagram is needed for estimation, all test patterns from test pattern 1 to test pattern 8 are used to be the input pattern of the target electronic system 101. If only the inner boundary of the eye diagram is needed for estimation, test patterns 1-4 are used to be the input pattern of the target electronic system 101. If the outer boundary of the eye diagram is needed for estimation, test patterns 6-8 are used to be the input pattern of the target electronic system 101.

Please also note that in the foregoing examples, only the victim test pattern or the aggressor test pattern is changed to obtain multiple output responses, without changing the configuration of the victim signal path MS and the aggressor signal paths AS1, AS2. However, in another embodiment, the configuration of the victim signal path MS and the aggressor signal paths AS1, AS2 can also be changed to obtain multiple output responses. For example, one of the aggressor signal paths AS1 and AS2 can be chosen as the victim signal path, and the original victim signal path MS is used as the aggressor signal path. Moreover, there can be more than one victim signal path, and the aggressor signal path is not limited to two.

In one embodiment, after a plurality of output responses are used to estimate the performance of the target electronic system 101 and a plurality of combination levels are obtained, it is determined whether the worse-case eye diagram pass the specification (such as a minimum performance level required by the standards of a circuit or a device), to determine whether the target electronic system 101 can be used or whether it needs to be adjusted. However, the combination levels are not limited to such application. For example, in one embodiment, better combination levels are chosen from a plurality of combination levels, and the input signals of the target electronic system 101 are limited to the test pattern combinations corresponding to the better combination level. Such variations and applications should also fall in the scope of the present invention.

Figure 2:
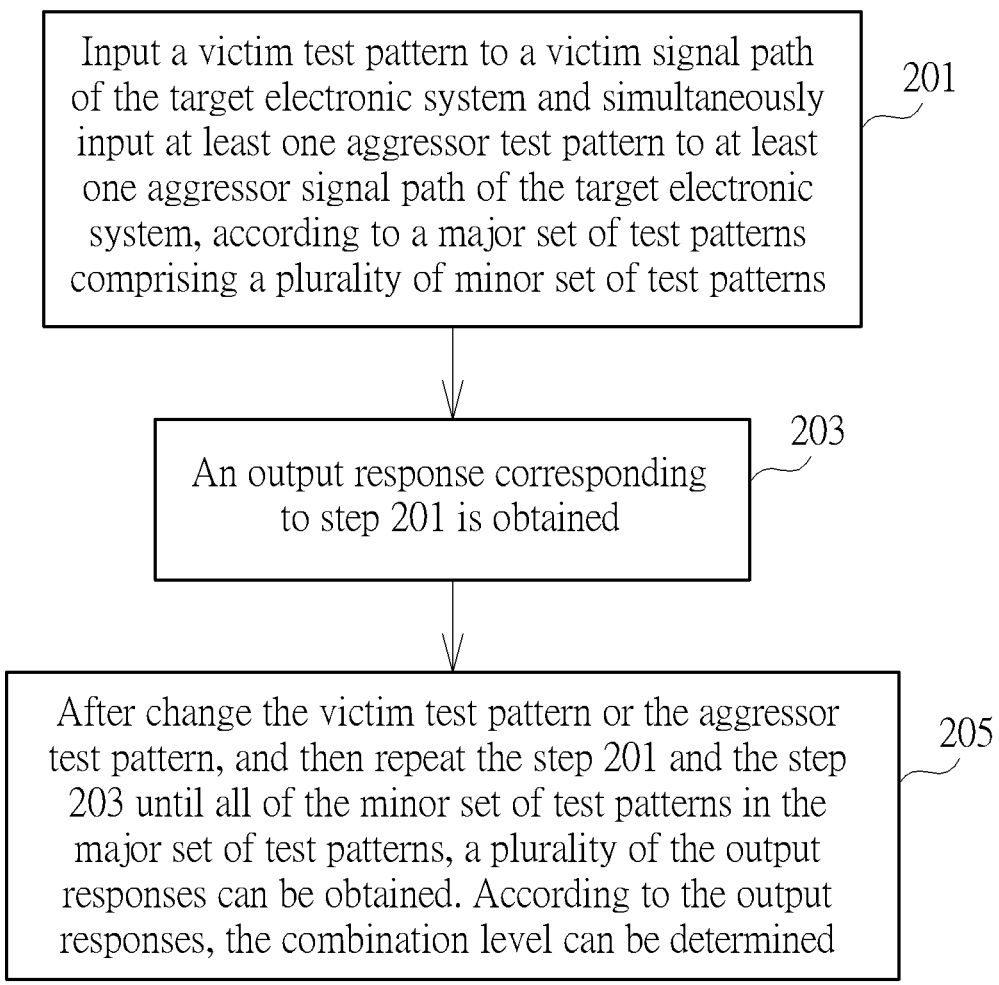
FIG. 2 is a flow chart illustrating an electronic device test method according to one embodiment of the present invention.

According to the above-mentioned embodiments, an electronic device testing method can be obtained, which is used to estimate the performance of at least one output response of a target electronic system (such as 101). FIG. 2 is a flowchart illustrating an electronic device test method according to one embodiment of the present invention, which comprises the following steps:

Step 201

Input a victim test pattern (for example, MS) to a victim signal path (for example, MP) of the target electronic system and simultaneously input at least one aggressor test pattern (such as AS1, AS2) to at least one aggressor signal path of the target electronic system (such as AP1, AP2), according to a major set of test patterns comprising a plurality of minor set of test patterns.

The victim test pattern is an X bit pattern and the aggressor test pattern is a Y bit pattern, X and Y are positive integers larger than 3.

Step 203

An output response corresponding to step 201 is obtained.

Step 205

After change the victim test pattern or the aggressor test pattern, and then repeat the step 201 and the step 203 until all of the minor set of test patterns in the major set of test patterns, a plurality of the output responses can be obtained. According to the output responses, the combination level can be determined.

For example, as stated in the example in Table 1, the major set of test patterns comprises 8 minor set of test patterns. After the 8 test patterns are input in sequence, 8 output responses can be obtained. Then an eye diagram will be generated based on these 8 output responses to get the combination level.

Figure 3:
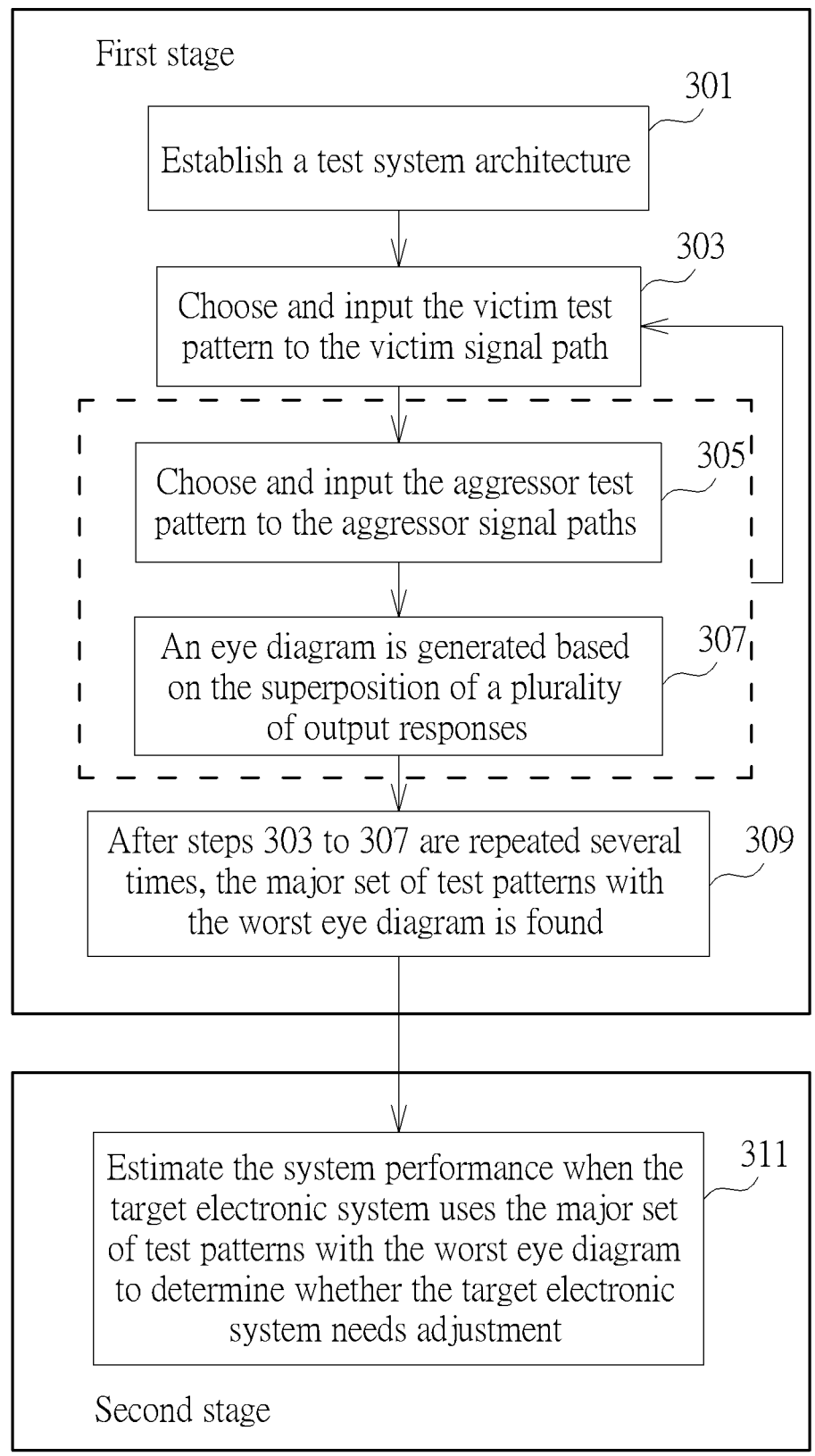
FIG. 3 is a more detail flow chart illustrating an electronic device test method according to one embodiment of the present invention.

FIG. 3 is a more detail flow chart illustrating an electronic device test method according to one embodiment of the present invention. That is, one example of a more detailed flowchart of the electronic device testing method shown in FIG. 2. The electronic device testing method shown in FIG. 3 comprises a first stage and a second stage. The first stage comprises steps 301-309, and the second stage comprises step 311. Steps 301-311 comprise the following steps:

Step 301

Establish a test system architecture, that is, set the test system to estimate the performance of the target electronic system. This step can comprise but is not limited to: choosing the path to be predicted, setting the system channel, and setting the load component. The system channel is the transmission path of the signal in the system, such as Netlist, S parameter, W-element, etc. The load components can be IBIS model or RLC components.

Step 303

Choose and input the victim test pattern to the victim signal path.

Step 305

Choose and input the aggressor test pattern to the aggressor signal paths.

Step 307

An eye diagram is generated based on the superposition of a plurality of output responses.

Steps 303 to 307 can be operated in parallel to reduce the estimation time. Take Table 1 as an example. The 8 test patterns can be calculated at the same time, and then the output responses can be combined.

Step 309

After steps 303 to 307 are repeated several times, the major set of test patterns with the worst eye diagram is found.

Step 311

Estimate the system performance when the target electronic system uses the major set of test patterns with the worst eye diagram to determine whether the target electronic system needs adjustment.

Figure 4:
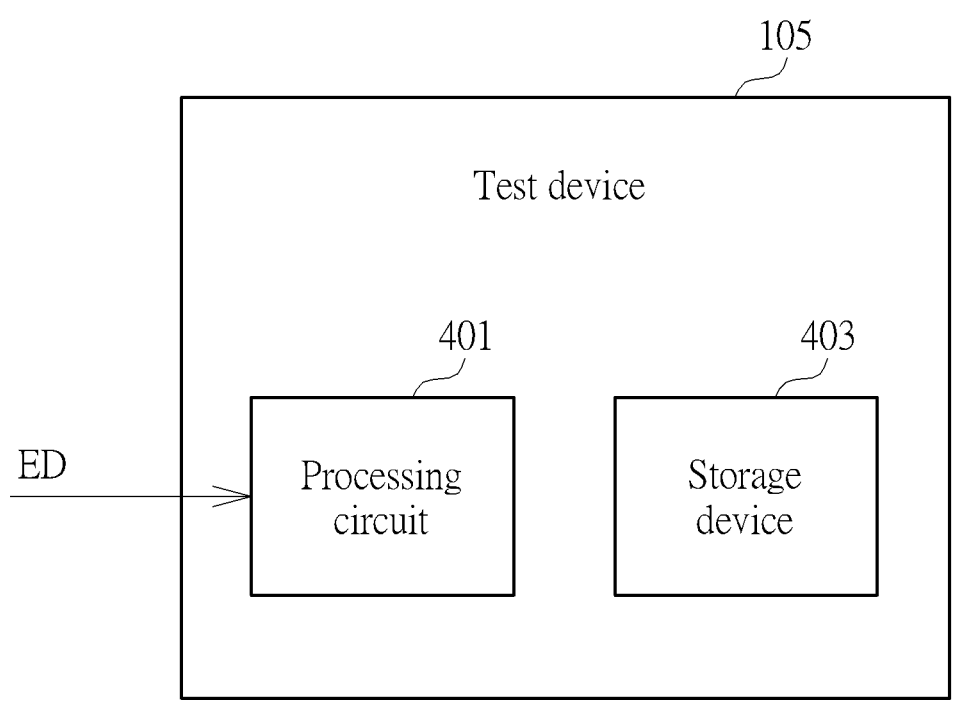
FIG. 4 illustrates a test device according to one embodiment of the present invention.

The test device 105 shown in FIG. 1 may comprise a variety of structures. FIG. 4 illustrates a test device according to one embodiment of the present invention. As shown in FIG. 4, the test device 105 comprises a processing circuit 401 and a storage device 403. The storage device 403 stores at least one program. The processing circuit 401 is configured to execute the stored program to perform the above-mentioned embodiments. Specifically, the processing circuit 401 can be used to calculate the combination level (such as the eye diagram ED) in FIG. 1, and respond to the tester's command or automatically generate instructions to control the test pattern generator (not shown) to generate the required test pattern. The test pattern generating device may be included inside the test device 105 or located outside the test device 105. Moreover, the storage device 403 may also be provided outside the test device 105.

In view of above-mentioned embodiments, the number of bits of the test pattern can be decreased to reduce the amount of data in the test process and the required test time. In addition to the signal integrity problems caused by the signal change of a single signal path, the cross talk effect caused by the adjacent signal path is also considered.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic system test method, for estimating the performance of a target electronic system, comprising:
   (a) inputting a victim test pattern to a victim signal path of the target electronic system and simultaneously inputting at least one aggressor test pattern to at least one aggressor signal path of the target electronic system, according to a major set of test patterns comprising a plurality of minor set of test patterns;
   (b) acquiring a output response corresponding to the step (a); and
   (c) after changing the victim test pattern or the aggressor test pattern, and after repeating the step (a) and the step (b) until all of the major test patterns set are used thereby acquiring a plurality of the output responses, determining a combination level according to the output responses;
   wherein the victim test pattern is an X bit pattern and the aggressor test pattern is a Y bit pattern, X and Y are positive integers larger than or equal to 3.

2. The electronic system test method of claim 1, wherein the step (a) inputs identical ones of the aggressor test pattern to different ones of the aggressor signal paths.

3. The electronic system test method of claim 2, wherein the victim test pattern and the aggressor test pattern are identical.

4. The electronic system test method of claim 1, X and Y are 3, and a number of the aggressor signal path is 2.

5. The electronic system test method of claim 4, wherein the victim test pattern comprises at least one of following values: 010, 100, 000 and 111.

6. The electronic system test method of claim 5, wherein the victim test pattern and the aggressor test pattern do not comprise any other value other than 010, 100, 000 and 111.

7. The electronic system test method of claim 4, wherein the victim test pattern comprises at least one of following values: 010, 100, 000 and 111, and the aggressor test pattern comprises at least one of following values: 010 and 101.

8. The electronic system test method of claim 7, wherein the victim test pattern and the aggressor test pattern do not comprise any other value other than 010, 100, 000 and 111.

9. The electronic system test method of claim 1, wherein the step (c) generates an eye diagram according to the output responses and determines the combination level according to the eye diagram.

10. The electronic system test method of claim 1, further comprising:
generating a plurality of the combination levels according to multiple major sets of test patterns;
determining whether the target electronic system can be used or needs adjustment according to the eye diagram by superposition a plurality of the output responses which correspond to the major set of test patterns with the worst case of the combination levels.

11. A test device, for estimating the performance of a target electronic system, comprising:
a storage device, configured to store at least one program; and
a processing circuit, configured to execute the program to execute an electronic system test method comprising:
(a) inputting a victim test pattern to a victim signal path of the target electronic system and simultaneously inputting at least one aggressor test pattern to at least one aggressor signal path of the target electronic system, according to a major set of test pattern comprising a plurality of minor set of test patterns;
(b) acquiring an output response corresponding to the step (a);
(c) after changing the victim test pattern or the aggressor test pattern, and after repeating the step (a) and the step (b) until all of the major test patterns set are used thereby acquiring a plurality of the output responses, determining a combination level according to the output responses;
wherein the victim test pattern is an X bit pattern and the aggressor test pattern is a Y bit pattern, X and Y are positive integers larger than 3.

12. The test device of claim 11, wherein the step (a) inputs identical ones of the aggressor test pattern to different ones of the aggressor signal paths.

13. The test device of claim 12, wherein the victim test pattern and the aggressor test pattern are identical.

14. The test device of claim 11, X and Y are 3, and a number of the aggressor signal path is 2.

15. The test device of claim 14, wherein the victim test pattern comprises at least one of following values: 010, 100, 000 and 111.

16. The test device of claim 15, wherein the victim test pattern and the aggressor test pattern do not comprise any other value other than 010, 100, 000 and 111.

17. The test device of claim 14, wherein the victim test pattern comprises at least one of following values: 010, 100, 000 and 111, and the aggressor test pattern comprises at least one of following values: 010 and 101.

18. The test device of claim 17, wherein the victim test pattern and the aggressor test pattern do not comprise any other value other than 010, 100, 000 and 111.

19. The test device of claim 11, wherein the step (c) generates an eye diagram according to the output responses and determines the combination level according to the eye diagram.

20. The test device of claim 11, wherein the electronic system test method further comprises:
generating a plurality of the combination levels according to multiple major sets of test patterns;
determining whether the target electronic system can be used or needs adjustment according to the eye diagram by superposition a plurality of the output responses which correspond to the major set of test patterns with the worst case of the combination levels.

* * * * *